US008786054B2

(12) United States Patent
Harn et al.

(10) Patent No.: US 8,786,054 B2
(45) Date of Patent: Jul. 22, 2014

(54) STRUCTURE FOR INTEGRATED CIRCUIT ALIGNMENT (75) Inventors: Yu-Chyi Harn, Bao-Shan (TW); Sophia Wang, Xin-Zhu (TW); Chun-Hung Lin, Taoyuan (TW); Hsien-Wei Chen, Sinying (TW); Ming-Yen Chiu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 481 days.

(21) Appl. No.: 12/619,460

(22) Filed: Nov. 16, 2009

(65) Prior Publication Data

US 2011/0115057 A1 May 19, 2011

(51) Int. Cl.
*H01L 23/48* (2006.01)

(52) U.S. Cl.
USPC ............... 257/620; 257/757; 257/E23.194; 257/E23.179

(58) Field of Classification Search
USPC .................................... 257/620, 757
See application file for complete search history.

(56) References Cited

U.S. PATENT DOCUMENTS

| 6,118,185 | A | 9/2000 | Chen et al. |
| 6,815,128 | B2 | 11/2004 | Rumsey et al. |
| 6,877,152 | B2 | 4/2005 | Gau et al. |
| 6,975,974 | B2 | 12/2005 | Chien et al. |
| 7,202,550 | B2 | 4/2007 | Fu et al. |
| 7,218,400 | B2 | 5/2007 | Ho et al. |
| 7,265,436 | B2 | 9/2007 | Huang et al. |
| 7,378,720 | B2 * | 5/2008 | Fu et al. ................ 257/620 |
| 7,483,156 | B2 * | 1/2009 | Cho ........................ 356/635 |
| 2003/0209812 | A1 * | 11/2003 | Nin ......................... 257/797 |
| 2007/0187845 | A1 | 8/2007 | Fu et al. |
| 2009/0225331 | A1 * | 9/2009 | Van Haren ............. 356/614 |
| 2010/0078769 | A1 * | 4/2010 | West et al. ............. 257/620 |

FOREIGN PATENT DOCUMENTS

CN 1202559 5/2005

OTHER PUBLICATIONS

Author Unknown, "Alignment and Overlay" Microlithography Systems Laboratory, Microelectronic Engineering Department, 6 pages.
Chinese Patent Office, Office Action dated Aug. 13, 2012, Application No. 201010147699.6, 10 pages.

* cited by examiner

*Primary Examiner* — S. V. Clark
*Assistant Examiner* — Krista Soderholm
(74) *Attorney, Agent, or Firm* — Haynes and Boone, LLP (57) ABSTRACT A method and device for pattern alignment are disclosed. The device can include an exposure field; a die within the exposure field, wherein the die comprises an integrated circuit region, a seal ring region, and a corner stress relief region; and a die alignment mark disposed between the seal ring region and the corner stress relief region.

20 Claims, 10 Drawing Sheets

STRUCTURE FOR INTEGRATED CIRCUIT ALIGNMENT

BACKGROUND

The semiconductor integrated circuit (IC) industry has experienced rapid growth. Technological advances in IC materials and design have produced generations of ICs where each generation has smaller feature sizes and more complex circuits than those from the previous generation. Conventionally, semiconductor devices are fabricated by patterning a sequence of patterned and un-patterned layers, and the features on successive patterned layers are spatially related to each other. During the fabrication, each patterned layer must be aligned with the previous patterned layers with a degree of precision. Pattern alignment techniques typically provide alignment marks to achieve overall exposure field alignment. As technology nodes continue to decrease, it has been observed that such alignment techniques provide less than desirable alignment within the field.

SUMMARY

The present disclosure provides for many different embodiments. An exemplary semiconductor wafer is provided. The semiconductor wafer comprises an exposure field; a die within the exposure field, wherein the die comprises an integrated circuit region, a seal ring region, and a corner stress relief region; and a die alignment mark disposed between the seal ring region and the corner stress relief region.

An exemplary method is also provided. The method may provide improved alignment of in-chip/die features. The method includes providing a semiconductor wafer; defining a field on the semiconductor wafer, wherein a perimeter of the field is defined by a scribe line; and defining a die area within the field, wherein a perimeter of the die is defined by a scribe line. Alignment marks are formed within the scribe line defining the perimeter of the field and in a corner portion of the die area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to manufacturing semiconductor devices, and more particularly, to pattern alignment methods and design structures for manufacturing these semiconductor devices.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
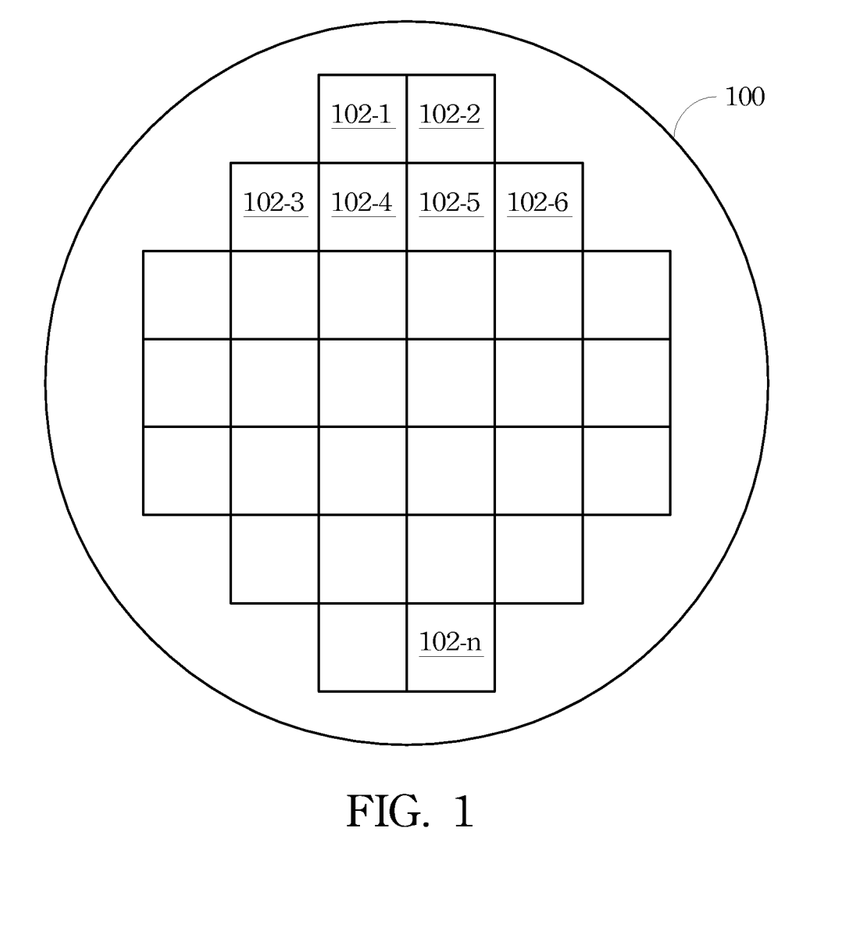
FIG. 1 illustrates a top view of a wafer according to various embodiments of the present disclosure.

FIG. 1 illustrates a wafer 100. The wafer 100 includes a substrate (e.g., a semiconductor substrate), a mask (photomask or reticle, collectively referred to as mask), or any base material on which processing is conducted to produce layers of material, pattern features, and/or integrated circuits. For example, the wafer 100 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In some examples, the silicon substrate may include a multilayer compound semiconductor structure. Alternatively, the wafer 100 may include a non-semiconductor material, such as a glass substrate for thin-film-transistor liquid crystal display (TFT-LCD) devices, or fused quartz or calcium fluoride for a photomask (mask).

The wafer 100 is subjected to one or more deposition, patterning, and/or etching process to form a plurality of patterned and un-patterned layers thereon. For example, the wafer 100 is subjected to a lithography process to form one or more features on the wafer. In the present embodiment, the wafer 100 is subjected to a lithography process to form an integrated circuit device thereon. The terms lithography, immersion lithography, photolithography, and optical lithography may be used interchangeably. The lithography process projects an image of an integrated circuit device onto an exposure field of the wafer 100. Or, put another way, the lithography process transfers a pattern (i.e., image of an integrated circuit device) from a mask (also referred to as a photomask or reticle) onto the wafer. The process can involve projecting the image multiple times on the wafer, each projection patterning an exposure field of the wafer. As illustrated in FIG. 1, the wafer 100 is divided into one or more fields 102. The wafer is divided into exposure fields 102-1, 102-2, 102-3, 102-4, 102-5, 102-6, . . . , and 102-n. An exposure field includes an area of a substrate covered (e.g., exposed) by a single exposure process. So, when the wafer 100 is subjected to a lithography process, a single exposure process may be used to transfer a pattern to each field (i.e., 102-1, 102-2 . . . 102-n) to form integrated circuits within each field.

Figure 2:
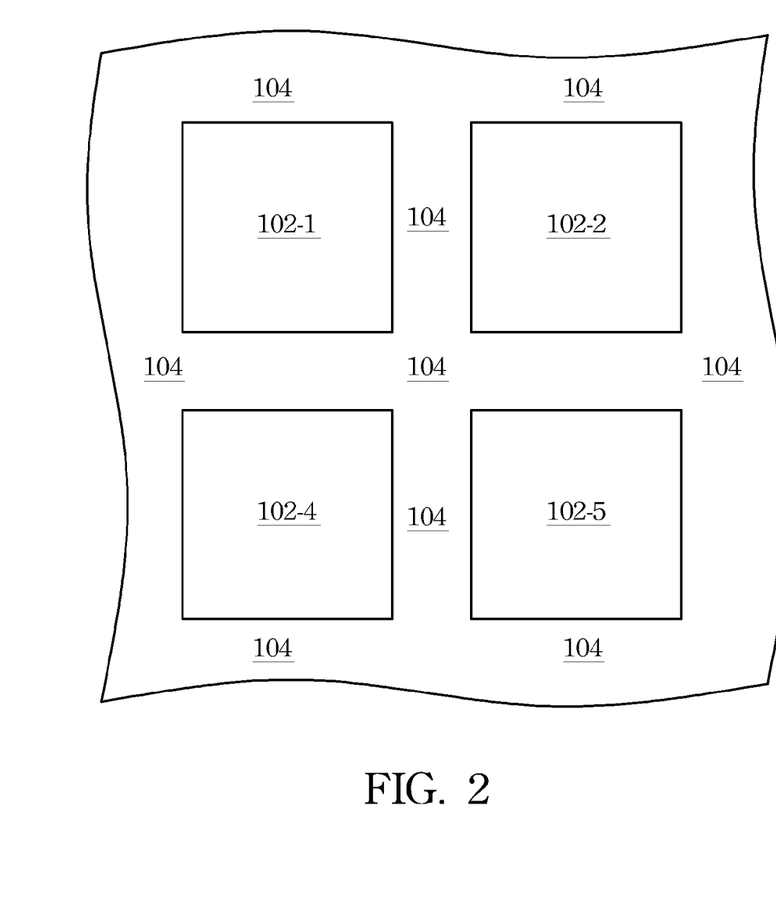
FIG. 2 illustrates an enlarged top view of a portion of the wafer of FIG. 1 according to various embodiments of the present disclosure.

FIG. 2 illustrates a magnified portion of the wafer 100 containing fields 102-1, 102-2, 102-4, and 102-5. The fields 102 are separated or defined by scribe lines (or lanes) 104. In the present embodiment, the scribe lines 104 are configured between each field 102 to identify a perimeter of each field 102. When each field 102 is exposed, one or more dies (chips) are patterned within the field.

Referring to FIGS. 3A-3F, one or more dies (chips) 200 of the wafer 100 are patterned within each exposure field 102, and thus, multiple dies can be patterned within a single exposure field. An exposure field can pattern a 1×1 chip array (FIG. 3A, a single chip 200-1 is patterned within exposure field 102-1); a 1×2 or 2×1 chip array (FIG. 3B, two chips 200-1, 200-2 are patterned within exposure field 102-1); a 2×2 chip array (FIG. 3C, four chips 200-1, 200-2, 200-3, 200-4 are patterned within exposure field 102-1); a 3×2 or 2×3 chip array (FIG. 3D, six chips 200-1, 200-2, 200-3, 200-4, 200-5, 200-6 are patterned within exposure field 102-1); a 3×3 chip array (FIG. 3E, nine chips 200-1, 200-2, 200-3, 200-4, 200-5, 200-6, 200-7, 200-8, 200-9 are patterned within exposure field 102-1); a 2×4 or 4×2 chip array (FIG. 3G, eight chips 200-1, 200-2, 200-3, 200-4, 200-5, 200-6, 200-7, 200-8 are patterned within exposure field 102-1); or other suitable chip arrays (chips 200-1 . . . 200-n are patterned within exposure field 102-1). Where multiple fields are delineated on the wafer 100, as in FIG. 1, the pattern is formed in each field 102. For example, if an exposure filed patterns a 2×2 chip array, each exposure field (i.e., fields 102-1, 102-2, . . . and 102-n) will include four patterned chips (200-1, 200-2, 200-3, 200-4). Similarly to delineation of the fields 102, scribe line regions separate (or define) adjacent dies 200. The scribe line regions/scribe lines 104 are dice/cut therethrough in a later fabrication process to provide individual dies, which may then be packaged and sold as individual integrated circuit chips. The scribe line regions are cut in such a way that the semiconductor devices in each die are not damaged.

As noted above, lithography processes form features on the wafer. In the present example, integrated circuit devices are formed on the wafer 100 to form a plurality of dies 200. The lithography process patterns a sequence of patterned and un-patterned layers, and the features on successive patterned layers are spatially related to each another. During fabrication, each patterned layer must be aligned with the previous patterned layers with a degree of precision. Thus, a key part of successful lithography relies on pattern recognition. Pattern recognition utilizes pattern alignment techniques. A lower (previous) patterned layer will include an overlay target, and a second pattern on an upper (next) patterned layer can then be aligned.

Conventional pattern alignment techniques form an alignment (or registration) mark 302 in the scribe lines surrounding each field 102. More particularly, four alignment marks 302 are placed in the scribe lines 104 surrounding each field 102 as illustrated in FIGS. 3A-3F. The four alignment marks 302 utilize a box-in-box ("BIB") pattern recognition technique for aligning successive patterned layers. Referring to FIG. 4, a box-in-box pattern recognition technique utilizes an overly target 302A, shown as an outer box, and an inner box 302B. The BIB pattern recognition technique aligns the inner box 302B with the overlay target 302A. For the sake of example, the outer box 302A can be formed in a lower (previous) patterned layer and the inner box 302B will be formed in an upper (next) patterned layer. There may be one or more layers between the two. The outer box 302A has a first range of dimensions, and the inner box 302B has a second range of dimensions. For example, a width of the outer box 302A may be in the range of between about 10 µm and about 40 µm, while a width of the inner box 302B may be between about 5 µm and about 30 µm. As a result, a distance d between the boxes 302A and 302B may be between about 5 µm and about 20 µm. It is noted that other sizes of the boxes 302A and 302B are also contemplated. The alignment mark 302 may be designed to include shapes other than boxes, including triangles, rectangles, circles, T-shapes, L-shapes, pluses, crosses, octagons, other suitable shapes, and/or combinations. It is understood that the pattern recognition may utilize other overlay target designs, such as frame-in-frame, segmented-frame, advanced imaging metrology (AIM), and short vernier (SVNR).

Though the conventional four corner BIB alignment marks 302 placed in the scribe lines surrounding each field 102 provide sufficient overall field alignment, as technology nodes continue to decrease, it has been observed that ensuring overall field alignment does not necessarily ensure satisfactory alignment of in-chip features, particularly as an exposure field 102 patterns multiple chips (e.g., 200-1 . . . 200-n). The present embodiments thus introduce alignment (registration marks) within a die/chip area of the field. More particularly, at least one alignment mark is formed in a corner of at least one die of the exposure field. The alignment marks formed within the fields 102 provide "eyes" inside the die/chip area 200, which provides improved overlay control.

Figure 3A:
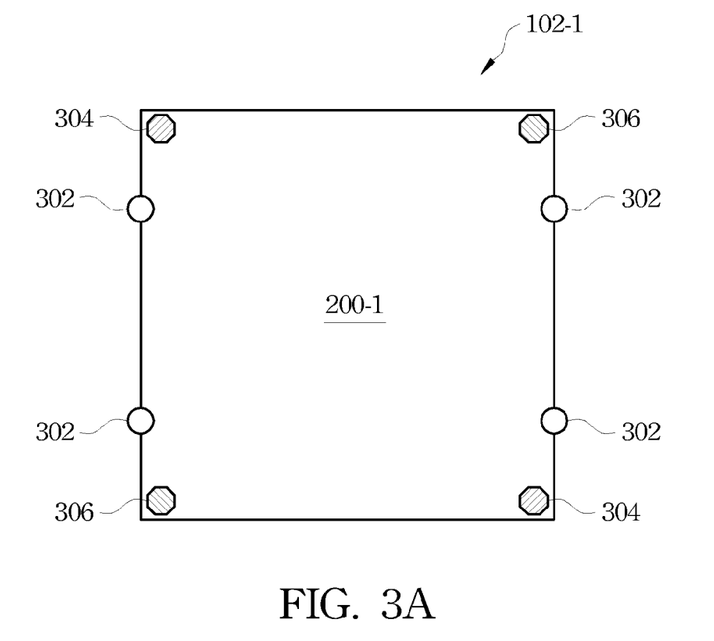
FIGS. 3A-3F illustrate top views of an exposure field according to various embodiments of the present disclosure.
Figure 3B:
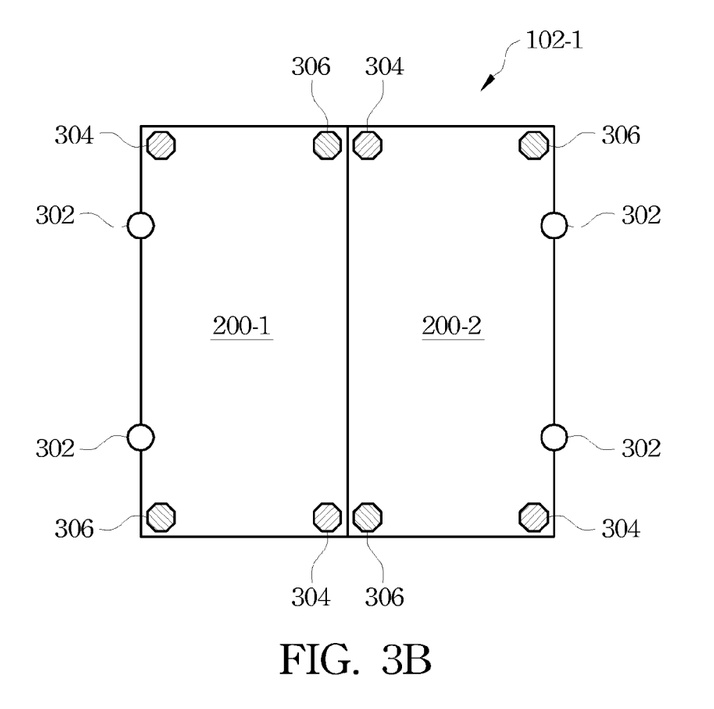
Figure 3C:
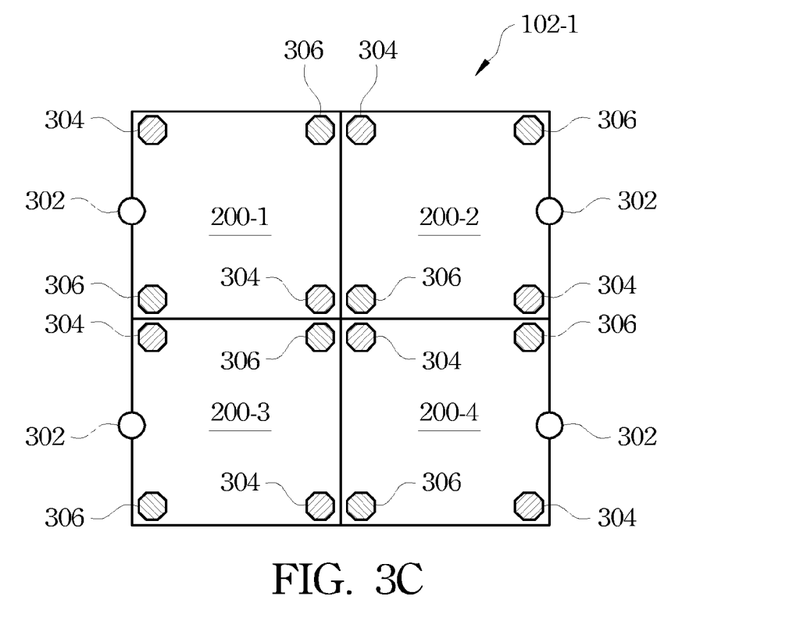
Figure 3D:
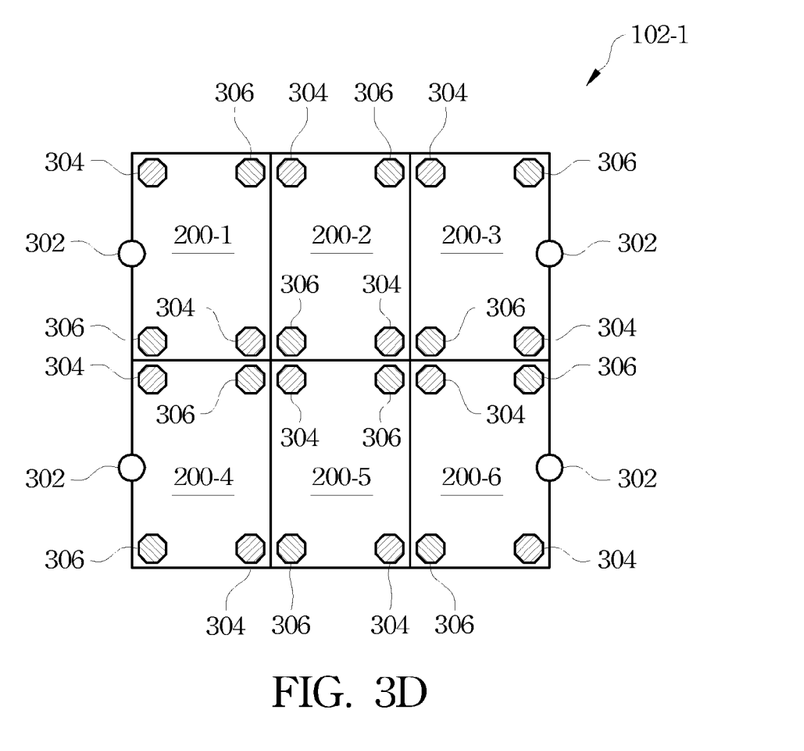
Figure 3E:
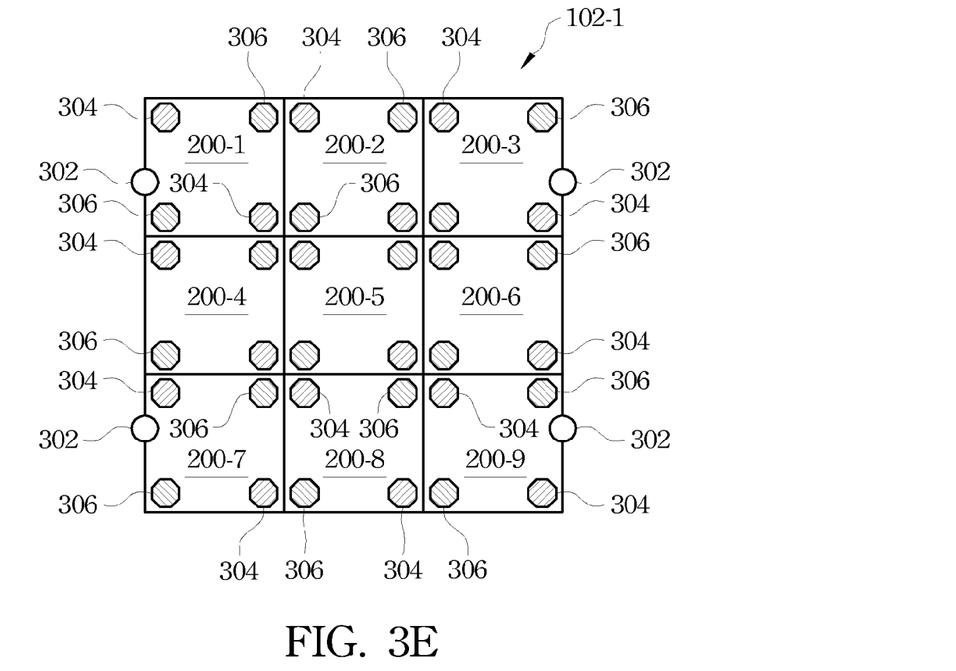
Figure 3F:
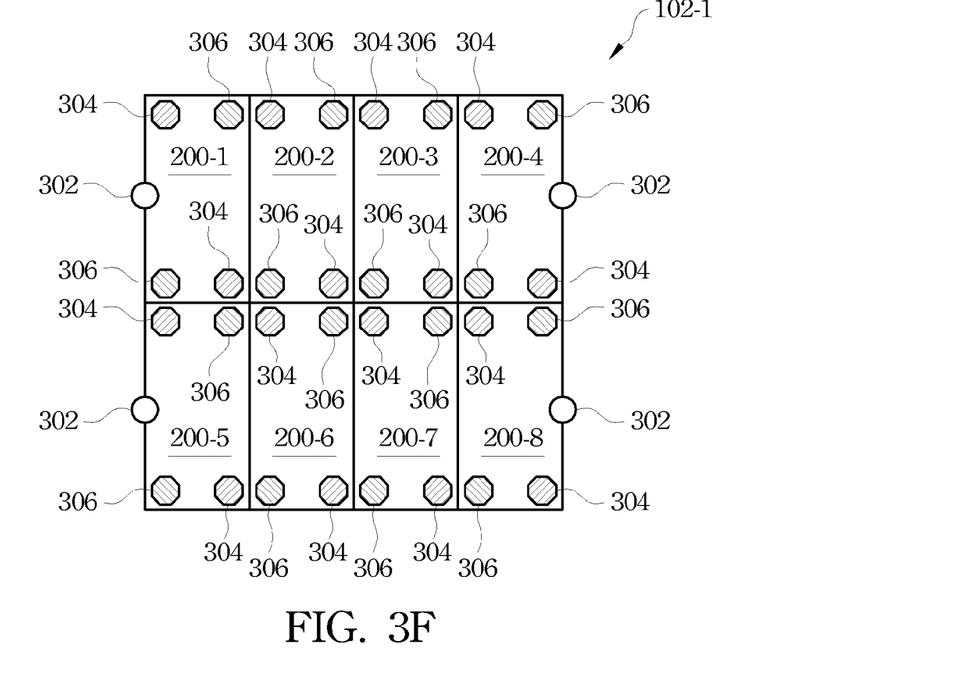
Figure 4:
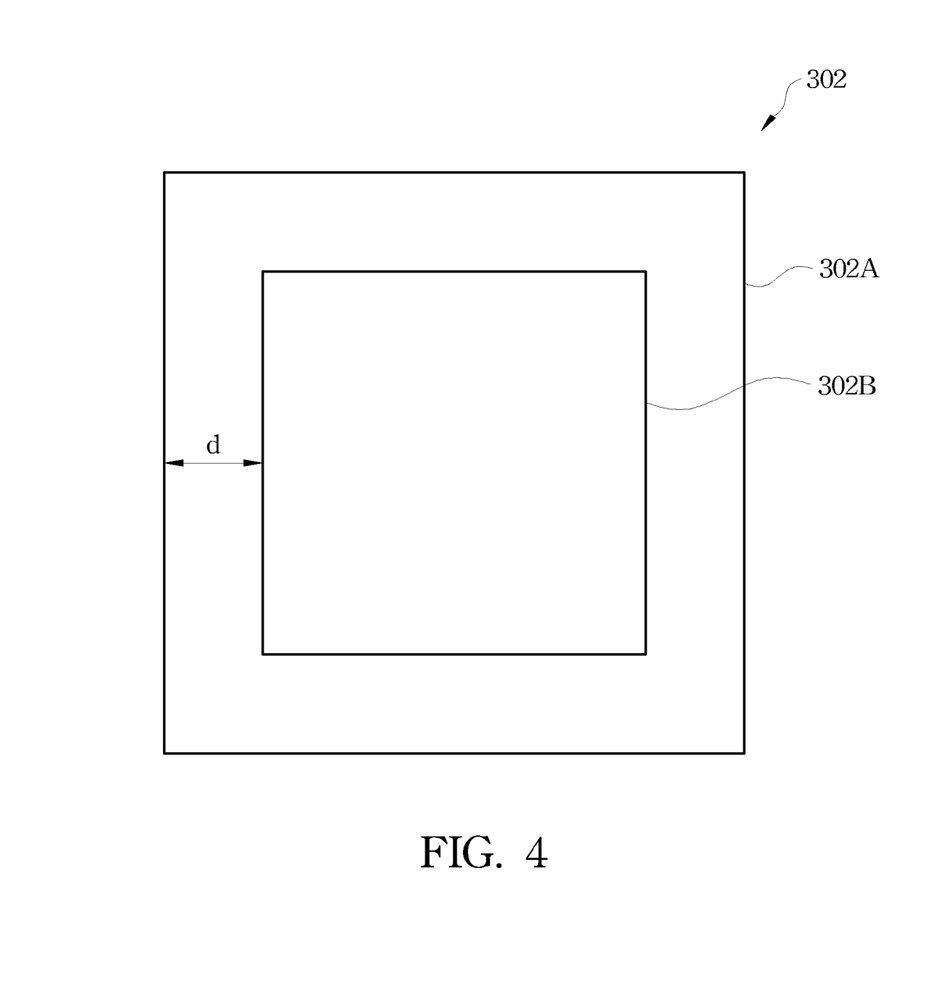
FIG. 4 illustrates a box-in-box alignment pattern according to various embodiments of the present disclosure.

Referring to FIGS. 3A-3F, in addition to alignment marks 302, which are placed in the scribe lines 104 surrounding each field 102, alignment marks 304, 306 are formed within the corners of each die 200 (e.g., in FIG. 3A, alignment marks 304, 306 are formed within the corners of die 200-1; in FIG. 3B, alignment marks are formed within the corners of dies 200-1, 200-2; in FIG. 3C, alignment marks are formed within the corners of dies 200-1, 200-2, 200-3, 200-4; etc.). As evident from FIGS. 3A-3F, as the number of dies 200 patterned within each field 102 increases, the alignment marks within the field increases, and accordingly, the information known within the field 102 is increased. For example, referring to FIG. 3C, within a 2×2 chip array, alignment information is obtained at the center of the field 102 by the four alignment marks 304, 306. This provides "eyes" within the field 102 and within each die 200 patterned in the field 102, which can provide improved overlay control. So, not only may overall field alignment be achieved, but also alignment of individual features within a field may be achieved. It is understood that alignment marks 304, 306 are not necessarily formed in the corners of every die 200 within an exposure field 102. As an example, in FIG. 3D, alignment marks 304, 306 may be included within at least one corner of dies 200-2 and 200-5. It is further understood that a variety of variations are contemplated. FIGS. 3A-3F are merely exemplary, and any combination of dies 200 within a field 102 or combination of corner alignment marks 304, 306 is contemplated.

Figure 5:
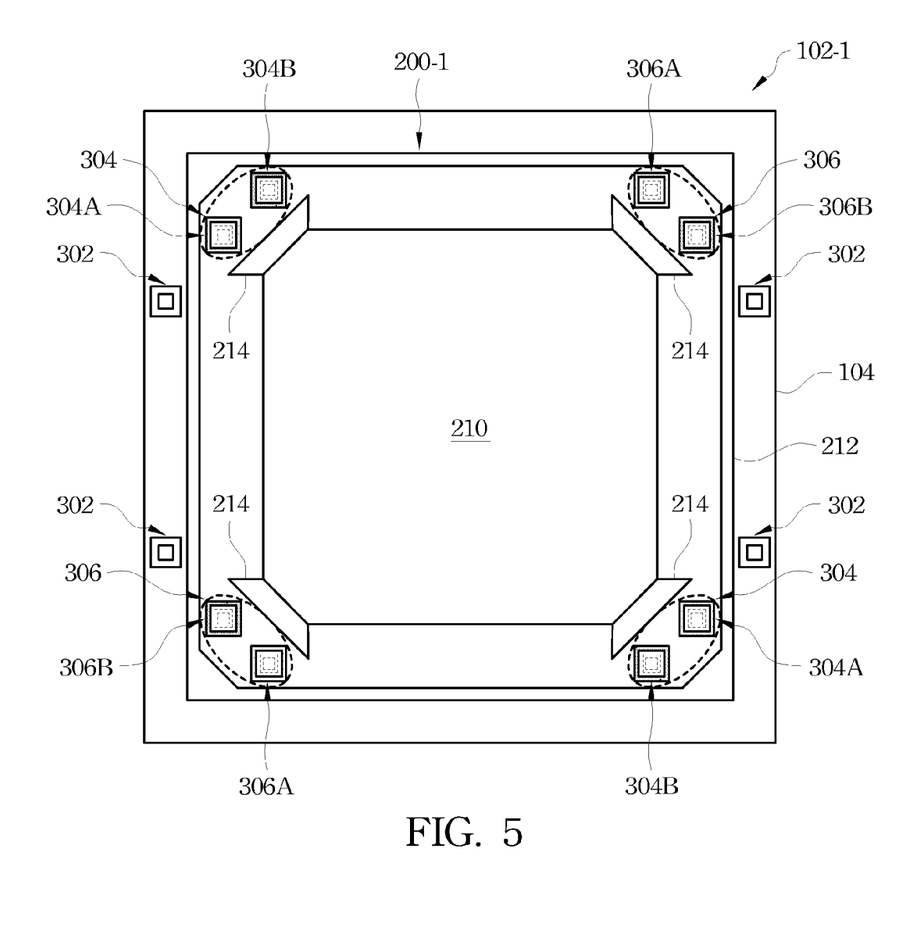
FIG. 5 illustrates a top view of an exposure field according to various embodiments of the present disclosure.

FIG. 5 provides an exemplary field 102-1 for patterning a 1×1 chip array, such as FIG. 3A, where a single chip 200-1 is patterned within exposure field 102-1. Chips 200-1, 200-2, . . . and 200-n may be configured similar to chip 200-1. As noted above, the scribe lines 104 define the perimeter of the field 102-1 and the die area 200-1. The scribe lines 104 comprise any suitable dimensions.

The die 200-1 includes an integrated circuit region 210. The integrated circuit region comprises a plurality of layers, such as active layers (OD layers, defining active areas of the integrated circuit region), poly layers (PO layers, defining gate areas of the integrated circuit region), contact layers (CO layers, defining contacts to the OD and POLY areas), N-well implant layers (NW layers), P-well implant layers (PW layers), P+ implant layers (PP layers), N+ layers (NP layers), metal layers (M1, M2, . . . MN), transistor threshold adjustment implant layers (VT layers), and/or other suitable layers. The plurality of layers in the integrated circuit region 210 form a variety of devices, including passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof.

The die 200-1 further includes a seal ring 212 and a corner stress relief zone 214. A portion of the corner of the die 200-1, which includes a portion of the seal ring 212 and corner stress relief zones 214, may be referred to as a die-corner-circuit-forbidden (DCCF) region. In the present embodiment, the seal ring 212 surrounds the perimeter of the integrated circuit region 210. The seal ring 212 creates a barrier to penetration of moisture, corrosive gasses, and chemicals into the interior of the integrated circuit region 210. The seal ring 212 may comprise multiple layers. For example, the seal ring may comprise a plurality of conductive layers, a plurality of insulating layers, a plurality of vias and contacts, a plurality of metal layers, and/or combinations thereof. It is understood that, in some embodiments, the die 200 may comprise only an integrated circuit region 210 without a surrounding seal ring 212.

The corner stress relief zone 214 is formed in each corner of the die 200-1. An exemplary shape of the corner stress relief zone 214 may be a trapezoid as illustrated in FIG. 5. Other shapes are contemplated. Each corner stress relief zone 214 can include one or more corner stress relief regions/zones. Examples of corner stress relief zones 214 are illustrated in U.S. Pat. No. 7,202,550 to Fu et al., entitled Integrated Stress Relief Pattern and Registration Structure, and U.S. Patent Application Publication No. 2007/0187845 to Fu et al., entitled Integrated Stress Relief Pattern and Registration Structure, both of which are hereby incorporated by reference in their entirety. It is understood that other corner stress relief zones are contemplated, and the Fu et al. references are not intended to be limiting.

The field 102-1 includes alignment marks 302, and the die 200-1 includes alignment marks 304, 306. The alignment marks 302 are formed in the four corner regions of the field 102-1 and provide overall field alignment (i.e., exposure field alignment marks). The alignment marks 304, 306 are formed in at least one corner region of the die 200-1 (i.e., die alignment marks). In the present example, the alignment marks 304, 306 are formed in the four corner regions of the die 200-1. More specifically, the alignment marks are formed within a region between the seal ring 212 and corner stress relief zones 214. Advantageously, the alignment marks 304, 306 do not occupy a large area. Since the alignment marks 304, 306 are formed between the seal ring 212 and corner stress relief zones 214, area for the integrated circuit region 210 is saved. Also, the alignment marks 304, 306 are easily integrated into current manufacturing processes, without requiring extraneous expenses or incorporating substantial process alterations. The alignment marks 304, 306 can provide "within field" overlay control, particularly overlay control between layers.

Figure 6A:
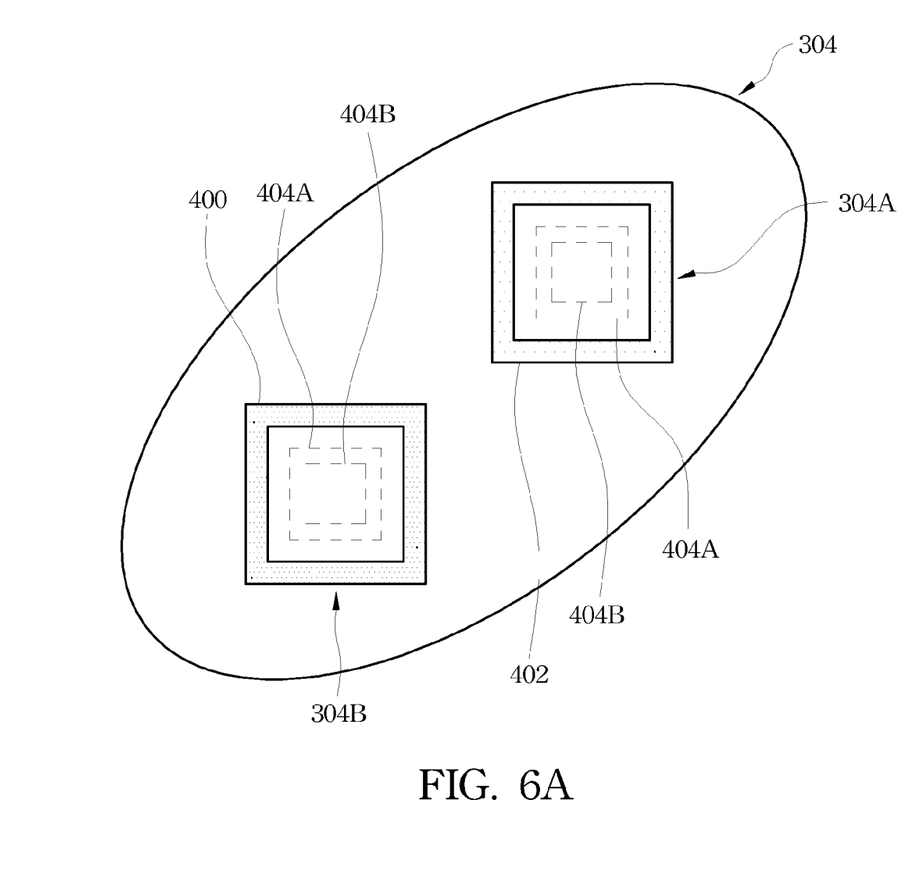
FIGS. 6A and 6B illustrate top views of an alignment mark according to various embodiments of the present disclosure.
Figure 6B:
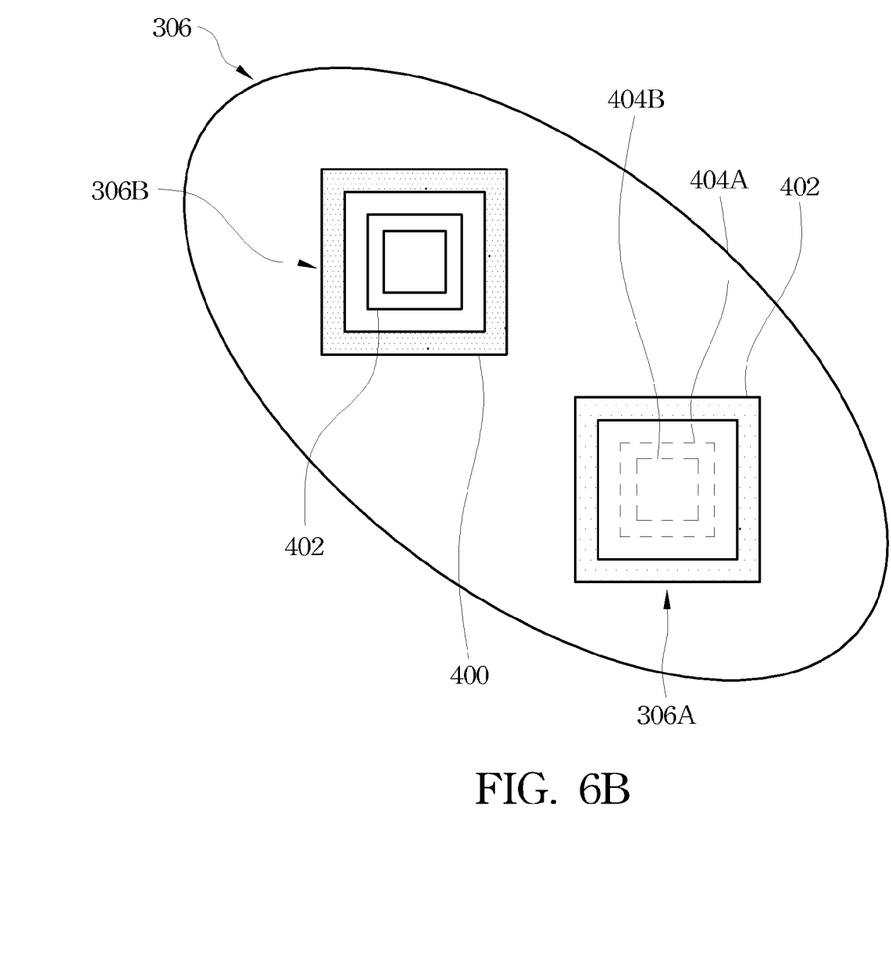

Similar to alignment mark 302, alignment marks 304, 306 utilize a box-in-box pattern recognition technique, which aligns a first overlay mark (outer box) formed in a lower patterned layer and a second overlay mark (inner box) formed in an upper patterned layer. Utilizing the BIB pattern recognition technique, overlay patterns/marks (outer and inner boxes) are formed in the various layers to provide various combinations of aligned layers. The alignment marks 304, 306 are formed to provide alignment of the various layers of the integrated circuit region 210. For example, overlay marks are formed in three layers: the OD, POLY, and CO layers. Referring to FIGS. 6A and 6B, overlay marks 400 are formed in an OD layer, overlay marks 402 are formed in a POLY layer, and overlay marks 404A, 404B are formed in a CO layer. Overlay marks 404A are formed in an outer CO layer, and overlay marks 404B are formed in an inner CO layer. The overlay marks may be formed in other suitable layers. Similarly to alignment marks 302, the overlay marks of alignment marks 304, 306 may be designed to include shapes other than boxes, including triangles, rectangles, circles, T-shapes, L-shapes, pluses, crosses, octagons, other suitable shapes, and/or combinations. Also, the pattern recognition techniques may utilize other overlay target designs, such as frame-in-frame, segmented-frame, advanced imaging metrology (AIM), and short vernier (SVNR).

The overlay marks (outer and inner boxes) are formed by any suitable process, including various photolithography, deposition, and/or etching processes. The overlay marks comprise any suitable material, such as a dielectric material, a conductive material, a photoresit material, and/or other suitable materials. In an example, the outer box may be a via hole, a trench, and/or any other opening. The outer box may be filled with one or more plugs. One or more contrast enhancing materials may be added to the overlay mark materials. The one or more contrast enhancing materials may include a variety of materials, such as one or more dyes, and/or other materials. The dyes may include one or more organic and/or inorganic materials. It is contemplated that the one or more contrast enhancing materials may be absorptive and/or reflective.

In an exemplary pattern recognition method, the outer box is exposed to radiation by a suitable generator known in the art. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths. Reflective beams from the outer box are then detected by a detector, which may include a wavelength dispersive spectrometer, an energy dispersive spectrometer, and/or other detectors. When the reflective beams are detected, the location of the outer box may be identified. As a result, the inner box may be properly positioned.

Referring to FIGS. 5, 6A, and 6B, each alignment mark 304, 306 includes one or more alignment marks. The alignment marks 304, 306 include any combination of overlay marks. As shown in FIG. 6A, alignment mark 304 includes alignment marks 304A, 304B. Alignment mark 304A includes an outer box (overlay mark) 400 formed in a lower OD layer, a first inner box (overlay mark) 404A formed in an upper outer CO layer, and a second inner box (overlay mark)

404B formed in an upper inner CO layer. The BIB pattern recognition technique aligns the second inner box 404B with the first inner box 404A, outer box 400, and the first inner box 404A with the outer box 400. The OD layer is thus aligned properly with the outer and inner CO layers. Alignment mark 304B includes an outer box (overlay mark) 402 formed in a lower POLY layer, a first inner box (overlay mark) 404A formed in an outer CO layer, and a second inner box (overlay mark) 404B formed in an inner CO layer. The BIB pattern recognition technique aligns the second inner box 404B with the first inner box 404A, outer box 402, and the first inner box 404A with the outer box 402. The POLY layer is thus aligned properly with the outer and inner CO layers.

As shown in FIG. 6B, alignment mark 306 includes alignment marks 306A, 306B. Alignment mark 306A includes an outer box (overlay mark) 402 formed in a lower POLY layer, a first inner box (overlay mark) 404A formed in an upper outer CO layer, and a second inner box (overlay mark) 404B formed in an upper inner CO layer. The BIB pattern recognition technique aligns the second inner box 404B with the first inner box 404A, outer box 402, and the first inner box 404A with the outer box 402. The POLY layer is thus aligned properly with the outer and inner CO layers. Alignment mark 306B includes an outer box (overlay mark) 400 formed in a lower OD layer and an inner box (overlay mark) 402 formed in the POLY layer. The BIB pattern recognition technique aligns the inner box 402 with the outer box 400. The POLY layer is thus aligned properly with the OD layer.

The alignment marks 304, 306 comprise any suitable dimension, for example, length and width. In the present example, where two alignment marks (e.g., 304A, 304B or 306A, 306B) are formed within each corner region of the die 200, the alignment marks 304A, 304B, 306A, 306B comprise a dimension of about 20 µm×20 µm. In another example, each corner region of the die 200 includes five alignment marks comprising a dimension of about 10 µm×10 µm. These examples should not be interpreted to be limiting. For example, the alignment marks may comprise a length from about 1 µm to about 30 µm and/or a width from bout 1 µm to about 30 µm.

Figure 7:
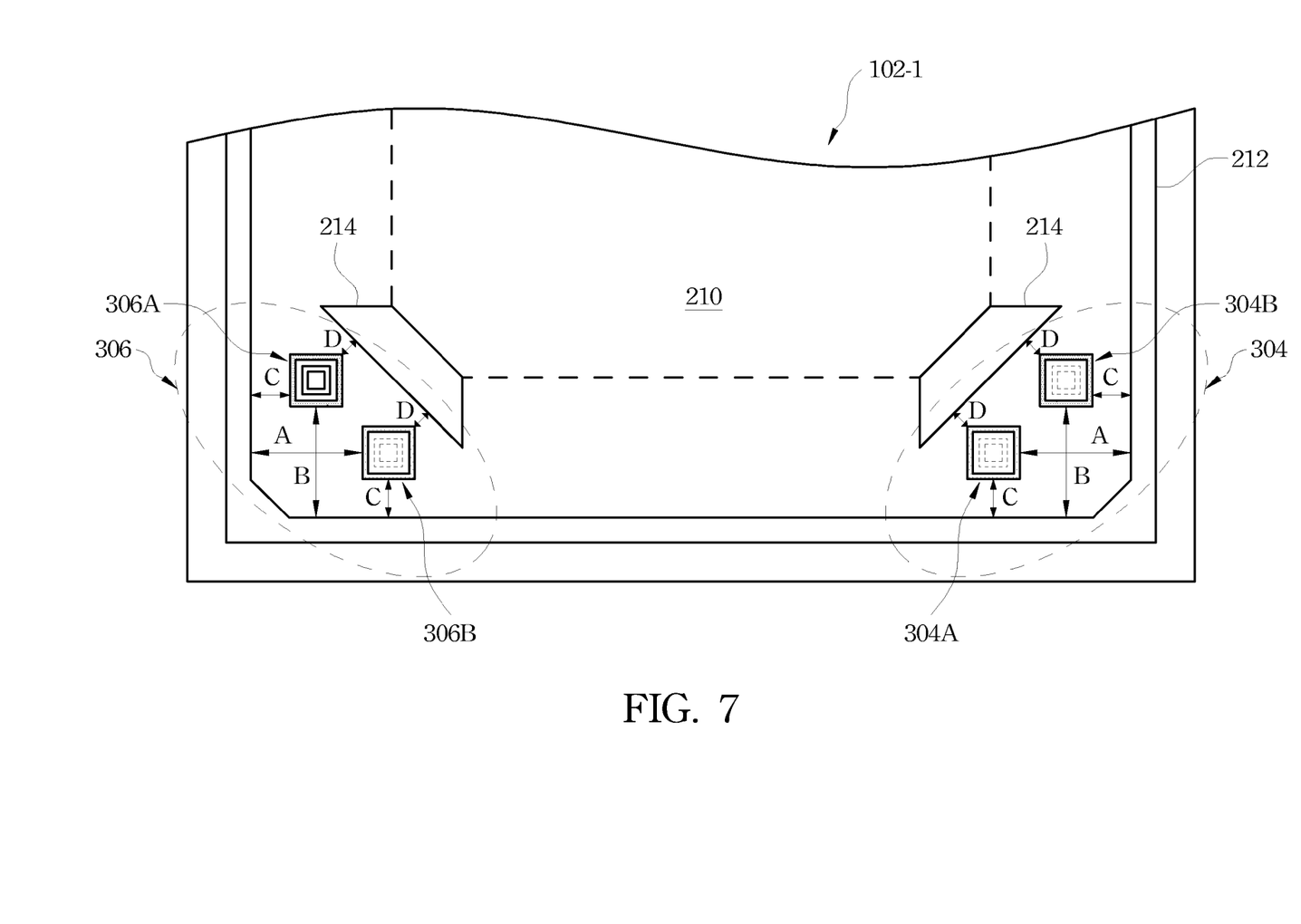
FIG. 7 illustrates an enlarged top view of a portion of the exposure field of FIG. 5 according to various embodiments of the present disclosure.

FIG. 7 illustrates an enlarged top view of a bottom portion of the exemplary field 102-1, with alignment mark 304 positioned in the right bottom corner and alignment mark 306 positioned in the left bottom corner. The positions of alignment marks 304, 306 may be reversed. As previously discussed, the alignment marks 304, 306 are formed between the seal ring 212 and corner stress relief regions 214. The alignment marks 304A, 304B, 306A, 306B are various distances from the seal ring 212 and corner stress relief regions 214. A side of the alignment marks 304A, 304B, 306A, 306B are a first distance A, B from the seal ring 212; a side of the alignment marks 304A, 304B, 306A, 306B are a second distance C from the seal ring 212; and a corner of the alignment marks 304A, 304B, 306A, 306B is a third distance D from at least one corner stress relief region 214. In an example, the first distance A,B is approximately 24 µm, the second distance C is approximately 4 µm, and the third distance D is approximately greater than 0 µm. A variety of distances are contemplated.

In summary, an improved pattern recognition technique as herein provided takes advantage of forming alignment marks within an exposure field. By providing alignment marks within an exposure field, alignment of in-chip features may be improved. Many variations of the above example are contemplated by the present disclosure. It is understood that different embodiments may have different advantages, and that no particular advantage is necessarily required of all embodiments.

The foregoing outlines features of several embodiments so that those skilled in the art may better understand the aspects of the present disclosure. Features illustrated and discussed above with respect to some embodiments can be combined with features illustrated and discussed above with respect to other embodiments. Those skilled in the art should appreciate that they may readily use the present disclosure as a basis for designing or modifying other processes and structures for carrying out the same purposes and/or achieving the same advantages of the embodiments introduced herein. Accordingly, all such modifications are intended to be included within the scope of this disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer comprising:
   an exposure field;
   a die within the exposure field, wherein the die comprises an integrated circuit region, a seal ring region, and a corner stress relief region; and
   a die alignment mark disposed between the seal ring region and the corner stress relief region without being disposed within any corner stress relief region and any seal ring region,
   wherein the die alignment mark is further disposed such that there is no seal ring region between the die alignment mark and the integrated circuit region, and
   wherein the corner stress relief region is free of any seal ring region.

2. The wafer of claim 1 further comprising:
   a scribe line defining the perimeter of the exposure field; and
   an exposure field alignment mark disposed within the scribe line defining the perimeter of the exposure field.

3. The wafer of claim 1 wherein the alignment mark comprises a box-in-box alignment pattern.

4. The wafer of claim 1 wherein the alignment mark includes at least one overlay mark.

5. The wafer of claim 4 wherein the overlay mark is formed in an active (OD) layer, a poly (POLY) layer, and/or a contact (CO) layer.

6. The wafer of claim 1 wherein the die alignment mark comprises a first alignment mark and a second alignment mark.

7. A semiconductor wafer comprising:
   an exposure field;
   a die within the exposure field, wherein the die comprises an integrated circuit region, a seal ring region, and a corner stress relief region; and
   a die alignment mark disposed between the seal ring region and the corner stress relief region without being disposed within any corner stress relief region and any seal ring region,
   wherein the corner stress relief region is free of any seal ring region,
   wherein there is not any seal ring region between the die alignment mark and the integrated circuit region, and
   wherein the die alignment mark comprises a first alignment mark and a second alignment mark.

8. The wafer of claim 7 further comprising a plurality of layers including an active (OD) layer, a poly (POLY) layer, and/or a contact (CO) layer.

9. The wafer of claim 8 wherein the first alignment mark includes an overlay mark formed in at least one of the OD, POLY, or CO layers.

10. A method comprising:
providing a semiconductor wafer;
defining a field on the semiconductor wafer, wherein a perimeter of the field is defined by a scribe line;
defining a die area within the field, wherein a perimeter of the die is defined by a scribe line;
forming an alignment mark within the scribe line defining the perimeter of the field; and
forming an alignment mark in a corner portion of the die area such that the alignment mark in the corner portion is disposed between a seal ring and a corner stress relief portion and between the seal ring and a circuit region without being disposed within any corner stress relief portion and any seal ring,
wherein there is not any seal ring between the alignment mark in the corner portion and the circuit region,
wherein the corner stress relief portion is free of any seal ring.

11. The method of claim 10 wherein forming the alignment marks comprises utilizing a box-in-box alignment pattern.

12. The method of claim 10 wherein forming the alignment mark in the corner portion of the die area comprises:
forming the seal ring in the die area; and
forming the corner stress relief portion in the die area.

13. The method of claim 10 wherein forming the alignment mark in the corner portion of the die area includes forming an overlay mark in an active (OD) layer, a poly (POLY) layer, and/or a contact (CO) layer.

14. The method of claim 10 further comprising:
performing a pattern recognition technique to align a mask with the alignment marks; and
exposing the semiconductor wafer to form an integrated circuit region.

15. The method of claim 10, wherein forming the alignment mark in the corner portion of the die area includes forming a first alignment mark and a second alignment mark, wherein the first and second alignment marks include a combination of overlay marks, the first alignment mark combination being different than the second alignment mark combination.

16. The wafer of claim 1, wherein the die alignment mark includes a first alignment mark and a second alignment mark, wherein the first and second alignment marks include a combination of overlay marks, the first alignment mark combination being different than the second alignment mark combination.

17. The wafer of claim 7, further comprising:
a scribe line defining the perimeter of the exposure field; and
an exposure field alignment mark disposed within the scribe line defining the perimeter of the exposure field.

18. The wafer of claim 9, wherein the second alignment mark combination is without an overlay mark formed in at least one of the OD, POLY, or CO layers.

19. The wafer of claim 7, wherein the first and second alignment marks include a combination of overlay marks, the first alignment mark combination being different than the second alignment mark combination.

20. The wafer of claim 1, wherein there is no other seal ring region closer to the die than the seal ring region.

* * * * *